(12) United States Patent
Lou

(10) Patent No.: US 9,351,401 B2
(45) Date of Patent: May 24, 2016

(54) DISPLAY PANEL AND DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventor: Tenggang Lou, Shanghai (CN)

(73) Assignees: Shanghai Tianma Micro-Electronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 209 days.

(21) Appl. No.: 14/304,804

(22) Filed: Jun. 13, 2014

(65) Prior Publication Data

US 2015/0163905 A1    Jun. 11, 2015

(30) Foreign Application Priority Data

Dec. 11, 2013  (CN) .......................... 2013 1 0676538

(51) Int. Cl.
*G02F 1/1345* (2006.01)
*H05K 1/11* (2006.01)
*G02F 1/133* (2006.01)
*H05K 1/14* (2006.01)
*H05K 1/18* (2006.01)
*G02B 5/20* (2006.01)

(52) U.S. Cl.
CPC ................ *H05K 1/11* (2013.01); *G02F 1/1345* (2013.01); *G02F 1/13306* (2013.01); *G02F 1/13452* (2013.01); *H05K 1/144* (2013.01); *H05K 1/181* (2013.01); *G02B 5/201* (2013.01)

(58) Field of Classification Search
CPC .......................... G02F 1/13452; G02F 1/13306
See application file for complete search history.

(56) References Cited

U.S. PATENT DOCUMENTS

2003/0030381 A1    2/2003  Yamazaki et al.
2013/0141683 A1*   6/2013  Chen ..................... G02F 1/1337
                                                         349/124

FOREIGN PATENT DOCUMENTS

CN          2757167 Y       2/2006

* cited by examiner

*Primary Examiner* — Phu Vu
(74) *Attorney, Agent, or Firm* — Alston & Bird LLP

(57) ABSTRACT

A display panel includes a first substrate including a first conducting wire disposed on an inner side of the first substrate, a second substrate disposed opposite to the first substrate, where a gate line and a first connecting terminal for transmitting a gate drive signal are disposed on a side of the second substrate facing the first substrate, the gate line includes a second connecting terminal at one end of the gate line; and a connecting layer disposed between the first substrate and the second substrate. The first connecting terminal and the second connecting terminal are electrically connected to two ends of the first conducting wire via the connecting layer respectively, and the second connecting terminal is electrically connected to the first connecting terminal via the first conducting wire, so the gate drive signal transmitted from the first connecting terminal is received by the gate line.

20 Claims, 8 Drawing Sheets

DISPLAY PANEL AND DISPLAY DEVICE

CROSS-REFERENCES TO RELATED APPLICATIONS

This application claims the benefit of priority to Chinese Patent Application No. 201310676538.X, filed with the Chinese Patent Office on Dec. 11, 2013 and entitled "DISPLAY PANEL AND DISPLAY DEVICE", the content of which is incorporated herein by reference in its entirety.

TECHNICAL FIELD

The disclosure relates to the field of display technology, and in particular to a display panel and a display device.

BACKGROUND OF THE INVENTION

Recently, a display device has become a popular consumer electronic device. The display device includes a display panel, and the display device with a narrow border has become more and more popular.

BRIEF SUMMARY OF THE INVENTION

Accordingly, it is provided a display panel and a display device according to the disclosure.

It is provided a display panel according to the disclosure, the display panel includes: a first substrate including a first conducting wire, where the first conducting wire is disposed on an inner side of the first substrate; a second substrate disposed opposite to the first substrate, where a gate line and a first connecting terminal for transmitting a gate drive signal are disposed on a side of the second substrate facing the first substrate, and the gate line includes a second connecting terminal at one end of the gate line; and a connecting layer disposed between the first substrate and the second substrate; where the first connecting terminal and the second connecting terminal are electrically connected to two ends of the first conducting wire via the connecting layer respectively, and the second connecting terminal is electrically connected to the first connecting terminal via the first conducting wire, to make the gate drive signal transmitted from the first connecting terminal be received by the gate line.

It is further provided a display device according to the disclosure, the display device includes the display panel described above.

DETAILED DESCRIPTION OF THE INVENTION

This disclosure describes aspects of exemplary embodiments and should not be used to limit the claims. The disclosure will be described in detail hereinafter in conjunction with the drawings and the specific embodiments.

Figure 1:
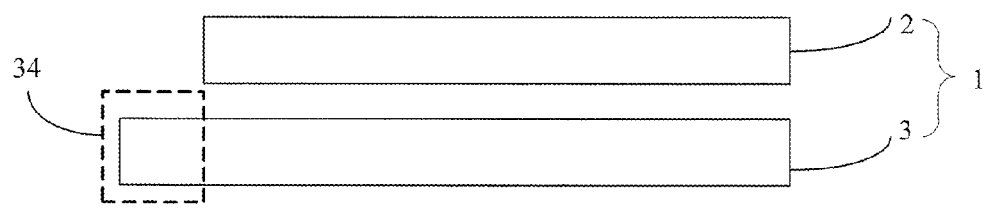
FIG. 1 is a schematic structural diagram of a display panel according to an embodiment of the disclosure.
Figure 2:
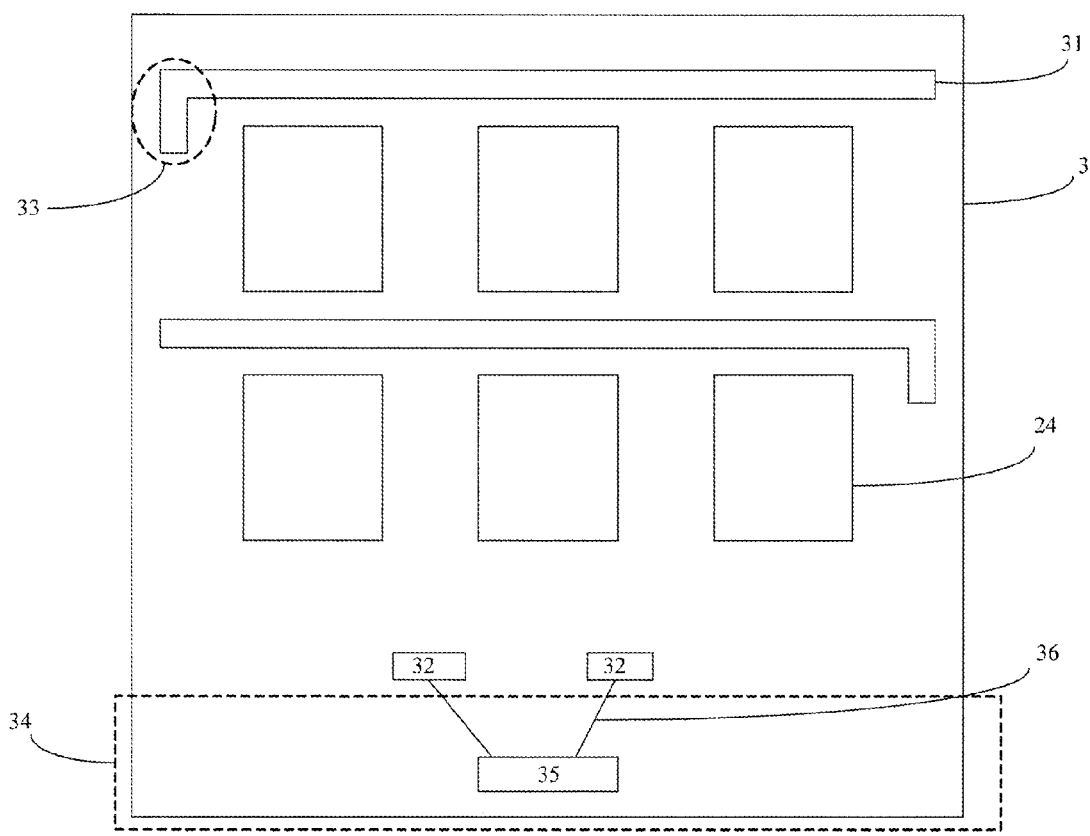
FIG. 2 is a top view of a second substrate according to an embodiment of the disclosure.

As shown in FIG. 1 and FIG. 2, a display panel 1 according to an embodiment of the disclosure includes a first substrate 2 and a second substrate 3 disposed opposite to each other, and a connecting layer (not shown) disposed between the first substrate 2 and the second substrate 3.

Figure 3:
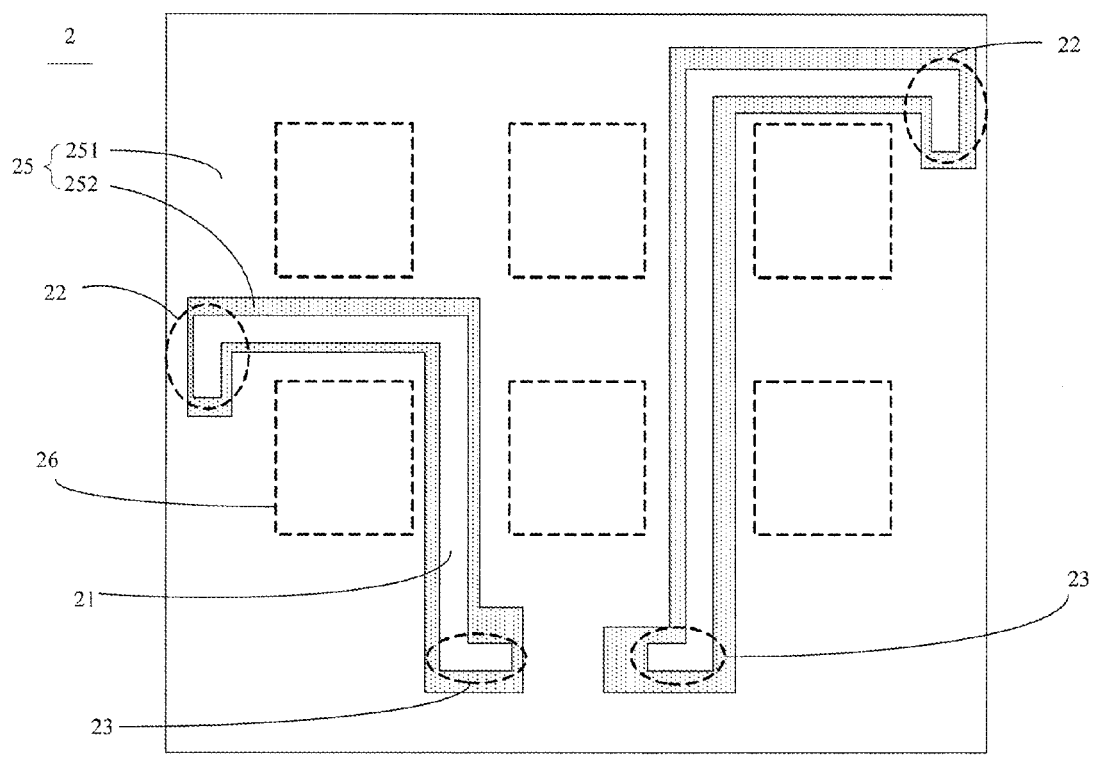
FIG. 3 is a top view of a first substrate according to an embodiment of the disclosure.

As shown in FIG. 1 and FIG. 2, a gate line 31 and a first connecting terminal 32 for transmitting a gate drive signal are disposed on a side of the second substrate 3 facing the first substrate 2, and the gate line 31 includes a second connecting terminal 33 located at one end of gate line 31. The second substrate 3 includes an extending portion 34, and the second substrate 3 extends out of the first substrate 2 by the extending portion 34(i.e., the extending portion 34 of the second substrate 3 is not overlapping with the first substrate 2). The second substrate 3 further includes a driver unit 35 and a second conducting wire 36 disposed at the extending portion 34. As shown in FIG. 1 and FIG. 3, a first conducting wire 21 is disposed on a side of the first substrate 2 facing the second substrate 3, and the first substrate 2 further includes a third connecting terminal 22 and a fourth connecting terminal 23 which are located at two ends of the first conducting wire 21 respectively.

As shown in FIG. 2 and FIG. 3, the driver unit 35 outputs a gate drive signal. The first connecting terminal 32 receives the gate drive signal transmitted from the driver unit 35 via the second conducting wire 36, and then the first connecting terminal 32 transmits the gate drive signal via the connecting layer and the first conducting wire 21. The first connecting terminal 32 and the second connecting terminal 33 are electrically connected to two ends of the first conducting wire 21 respectively via the connecting layer, and then the second connecting terminal 33 is electrically connected to the first connecting terminal 32 via the first conducting wire 21 so that the gate drive signal transmitted from the first connecting terminal 32 is received by the gate line 31.

The second connecting terminal 33 is electrically connected to the third connecting terminal 22 via the connecting layer, and the first connecting terminal 32 is electrically connected to the fourth connecting terminal 23 via the connecting layer, so that the second connecting terminal 33 is electrically connected to the first connecting terminal 32 and thereby the gate drive signal transmitted from the first connecting terminal 32 is received by the gate line 31.

Furthermore, the location of the first connecting terminal 32 on the second substrate 3 corresponds to the location of the fourth connecting terminal 23 on the first substrate 2, and the location of the second connecting terminal 33 on the second substrate 3 corresponds to the location of the third connecting terminal 22 on the first substrate 2.

In addition, the first substrate 2 further includes a black matrix layer (not shown), a color filter layer (not shown) and a common electrode layer 25 disposed on a side of the first substrate 2 facing the second substrate 3, the black matrix layer, the color filter layer and the common electrode layer 25 are disposed sequentially in a direction approaching (toward) the second substrate 3.The common electrode layer 25 includes a first electrode 251, the first electrode 251 and the first conducting wire 21 are disposed in a same layer, and a common potential is applied to the first electrode 251. The common electrode layer 25 further includes first slits 252. The first electrode 251 and the first conducting wire 21 are insulated from each other by the first slit 252. The color filter layer includes multiple color filter units 26, and the black matrix layer includes multiple first openings(not shown), the color filter units 26 are exposed through the first opening. The second substrate 1 further includes multiple pixel units 24, the pixel unit 24 and the color filter unit 26 are arranged in a one-to-one correspondence.

In addition, the first conducting wire 21 is made of a transparent conductive material or a metal. In a case that the first conducting wire 21 is made of a metal, the wiring of the first conducting wire 21 is not located in the area of the color filter unit 26. In a case that the first conducting wire 21 is made of a transparent conductive material, the wiring of the first conducting wire 21 may be disposed in the area of the color filter unit 26, or the wiring of the first conducting wire 21 may not be disposed in the area of the color filter unit 26.

In addition, the connecting layer is made of an anisotropic conductive film or a conductive gold ball. In a case that the connecting layer is made of the conductive gold ball, there are $1/30000$-$0.02$ conductive gold balls per square micrometer.

In the embodiment of the disclosure, the wiring(s) of the gate line(s) (including the gate line and its wirings) is transferred from the second substrate to the first substrate via the connecting layer, in other words, the first conducting wire is transferred from the second substrate to the first substrate via the connection of the connecting layer and the first conducting wire, specifically, the wiring of the first conducting wire may be arranged arbitrarily on the first substrate as long as the following conditions are met: in a case that the first conducting wire is made of a metal, the wiring of the first conducting wire is not located in the area of the color filter units, and in a case that the first conducting wire is made of a transparent conductive material, the wiring of the first conducting wire may be located in the area of the color filter units, or the wiring of the first conducting wire 21 may not be located in the area of the color filter units. Due to the transferring of the wiring of the first conducting wire, the border width of the second substrate may be further reduced, therefore, the border of the display panel is narrowed.

Figure 4:
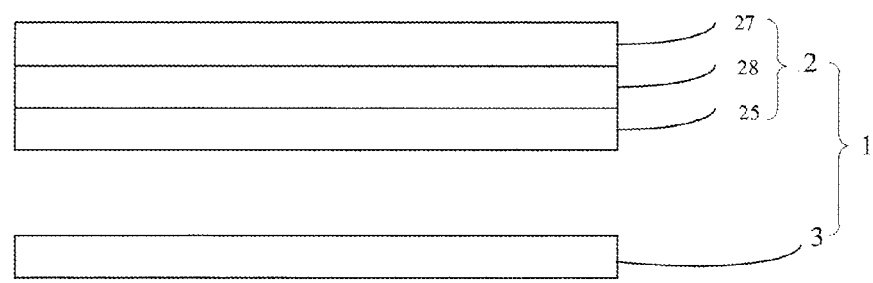
FIG. 4 is a schematic structural diagram of a portion of a display panel according to an embodiment of the disclosure.
Figure 5:
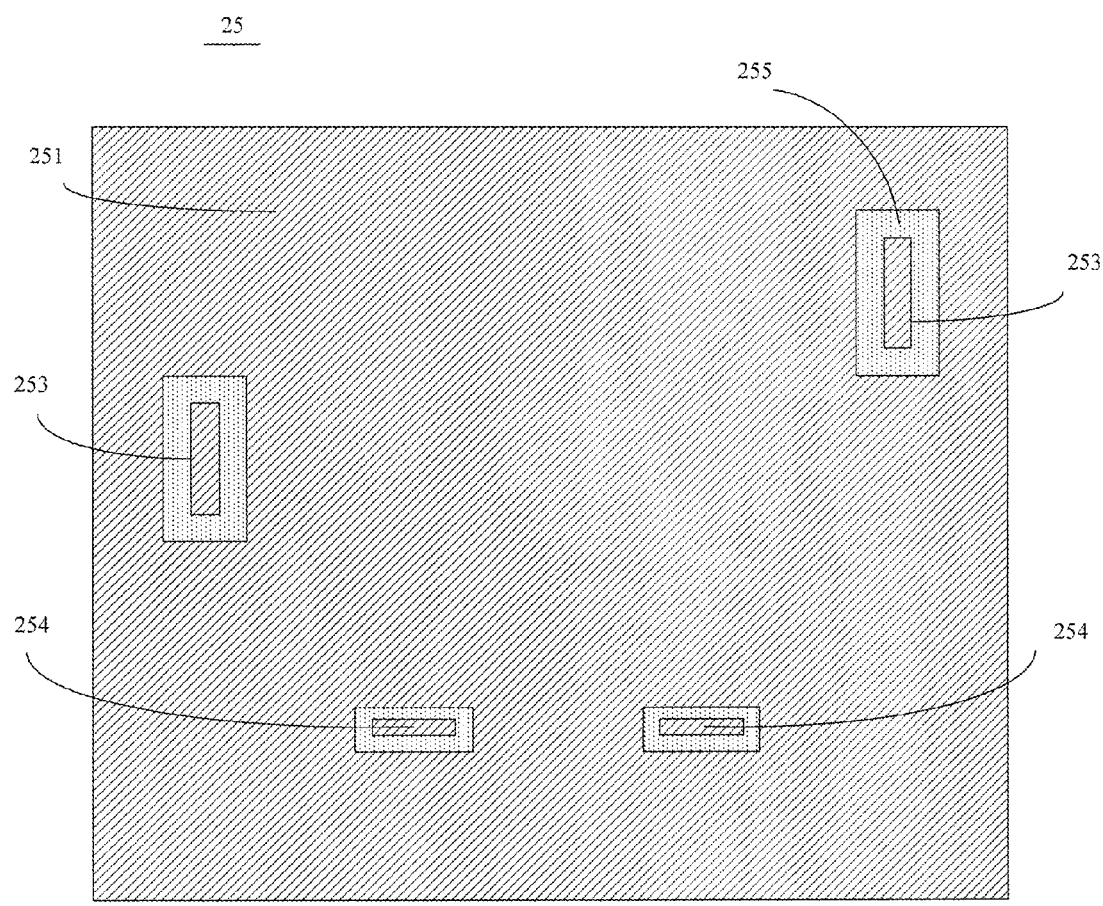
FIG. 5 is a schematic structural diagram of a common electrode layer according to an embodiment of the disclosure.

Another embodiment is further provided, and the same detail(s) with the above embodiment is not described repeatedly. In the present embodiment, the first conducting wire 21 is disposed in a different layer from the common electrode layer. As shown in FIG. 4, the first substrate 2 further includes a first conductive layer 27 and a first insulating layer 28, the first insulating layer 28 is disposed between the first conductive layer 27 and the common electrode layer 25, and the first conductive layer 27 is disposed on a side of the common electrode layer 25 facing away from the second substrate 3, where the first conducting wire 21 and the first conductive layer 27 are disposed in a same layer. As shown in FIG. 5, the common electrode layer 25 includes first electrode 251, a second electrode 253 and a third electrode 254, and the first electrode 251, the second electrode 253 and the third electrode 254 are insulated from one another. Preferably, the first electrode 251, the second electrode 253 and the third electrode 254 are insulated from one another by the second slits 255.

In the embodiment, as shown in FIG. 1, FIG. 3 and FIG. 5, the second electrode 253 is electrically connected to the third connecting terminal 22 so that the third connecting terminal 22 is electrically connected to the first connecting terminal 32 via the second electrode 253; the third electrode 254 is electrically connected to the fourth connecting terminal 23 so that the fourth connecting terminal 23 is electrically connected to the second connecting terminal 33 via the third electrode 254.

Specially, the location of the second electrode 253 on the first substrate 2 corresponds to the location of the third connecting terminal 22 on the first substrate 2; and the location of the third electrode 254 on the first substrate 2 corresponds to the location of the fourth connecting terminal 23 on the first substrate 2. In another embodiment, the location of the second electrode 253 on the first substrate 2 corresponds to the location of the fourth connecting terminal 23 on the first substrate 2; and the location of the third electrode 254 on the first substrate 2 corresponds to the location of the third connecting terminal 22 on the first substrate 2. It is noted that the location of the second electrode 253 on the first substrate 2 corresponds to the location of the third connecting terminal 22 on the first substrate 2 or the location of the fourth connecting terminal 23 on the first substrate 2, and the location of the third electrode 254 on the first substrate 2 corresponds to the location of the fourth connecting terminal 23 on the first substrate 2 or the location of the third connecting terminal 22 on the first substrate 2. It is not limited thereof.

Figure 6:
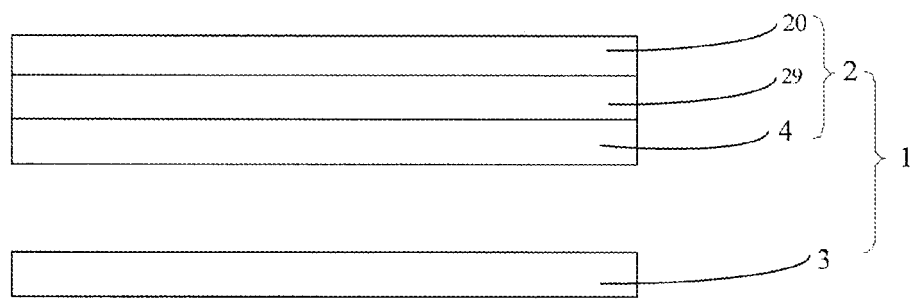
FIG. 6 is a schematic structural diagram of a display panel according to an embodiment of the disclosure.

Another embodiment is further provided, and the same detail(s) with the above embodiments is not described repeatedly. In this embodiment, the first substrate 2 does not include a common electrode layer. As shown in FIG. 6, in the embodiment, the first substrate 2 includes a second conductive layer 29 and a base substrate 20, the second conductive layer 29 is disposed on a side of the base substrate 20 facing the second substrate 3, and a common potential is not applied to the second conductive layer 29.

Figure 7:
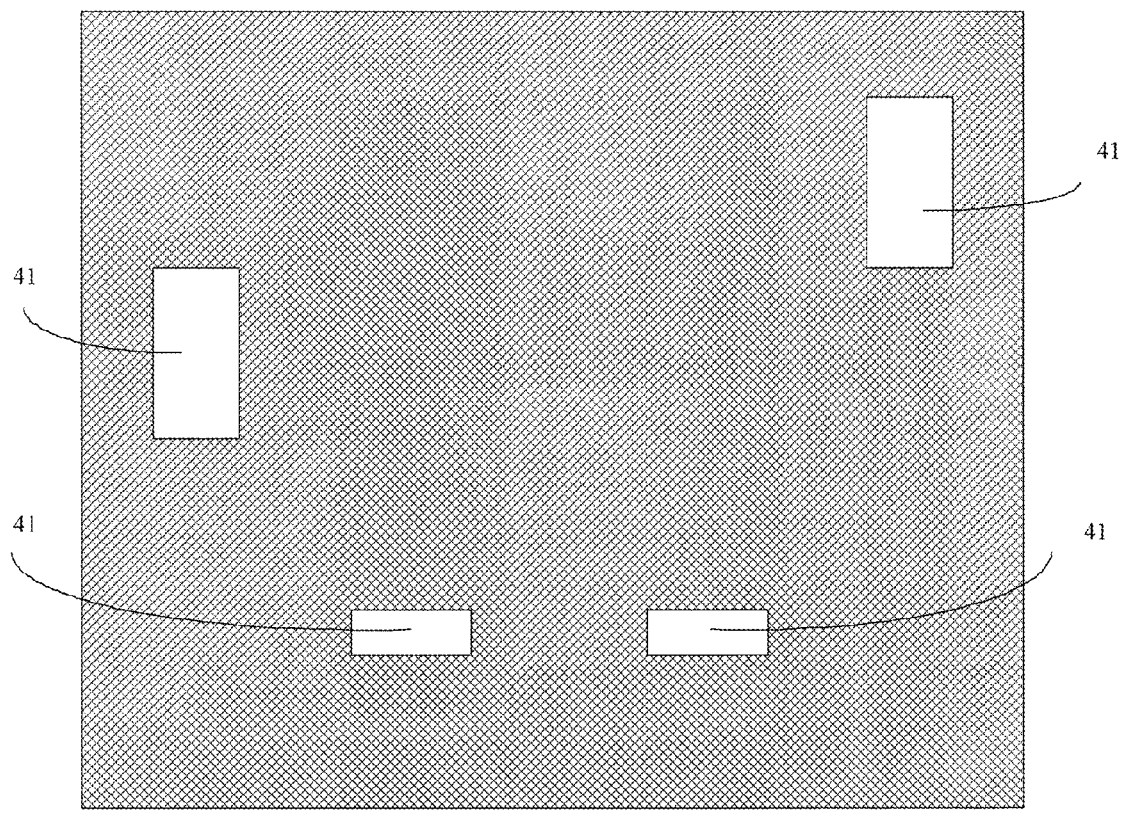
FIG. 7 is a schematic structural diagram of a planarization layer according to an embodiment of the disclosure.
Figure 8:
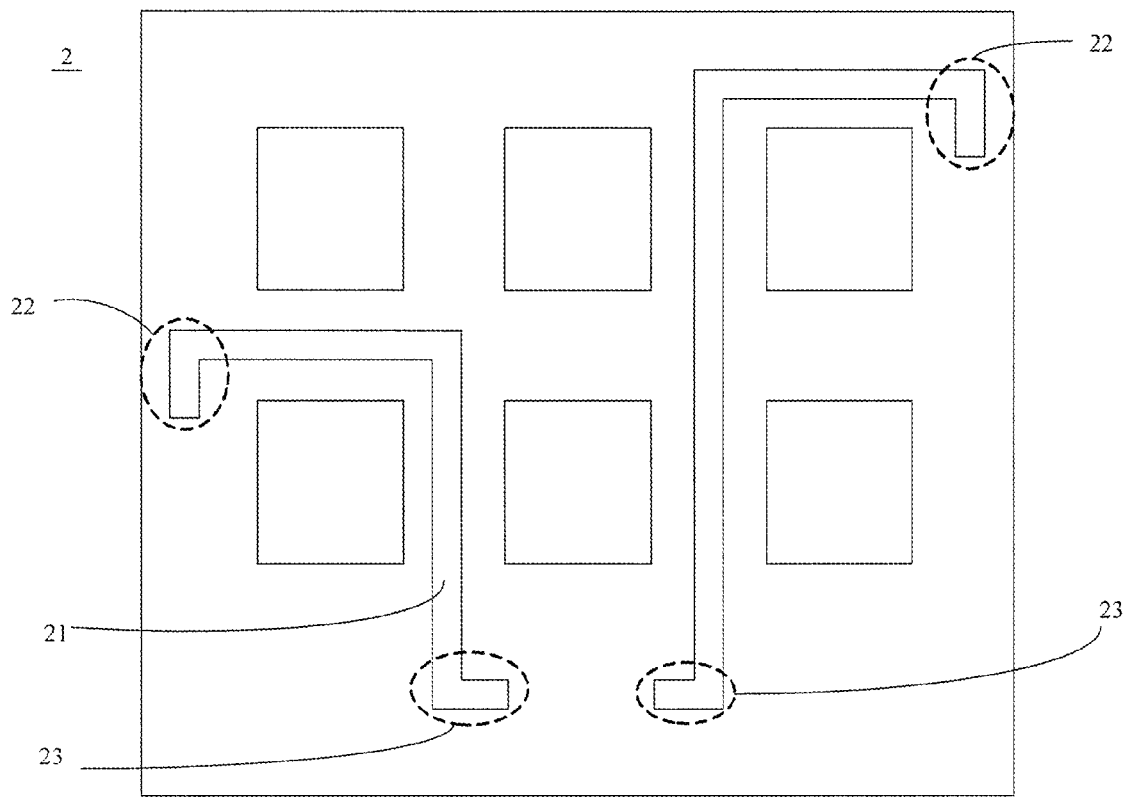
FIG. 8 is a top view of a first substrate according to an embodiment of the disclosure.

Further, as shown in FIG. 6, FIG. 7 and FIG. 8, the first conducting wire 21 and the second conductive layer 29 are disposed in a same layer. The first substrate 2 further includes a planarization layer 4 which is disposed on the side of the second conductive layer 29 facing the second substrate 3, namely, the second conductive layer 29 is disposed between the planarization layer 4 and the base substrate 20. In the embodiment, the planarization layer 4 is disposed on the whole surface of the base substrate 20 facing the second substrate, namely, the planarization layer 4 covers the wiring region of the first conducting wire 21, the planarization layer 4 includes multiple second openings 41, and the locations of the second openings 41 on the first substrate 2 correspond to the locations of the third connecting terminal 22 and the fourth connecting terminal 23 on the first substrate 2 respectively, so that the third connecting terminals 22 and the fourth connecting terminals 23 are exposed through the second openings 41.

Further, the number of the second openings 41 is equal to the sum of the number of the third connecting terminals 22 and the number of the fourth connecting terminals 23.

Figure 9:
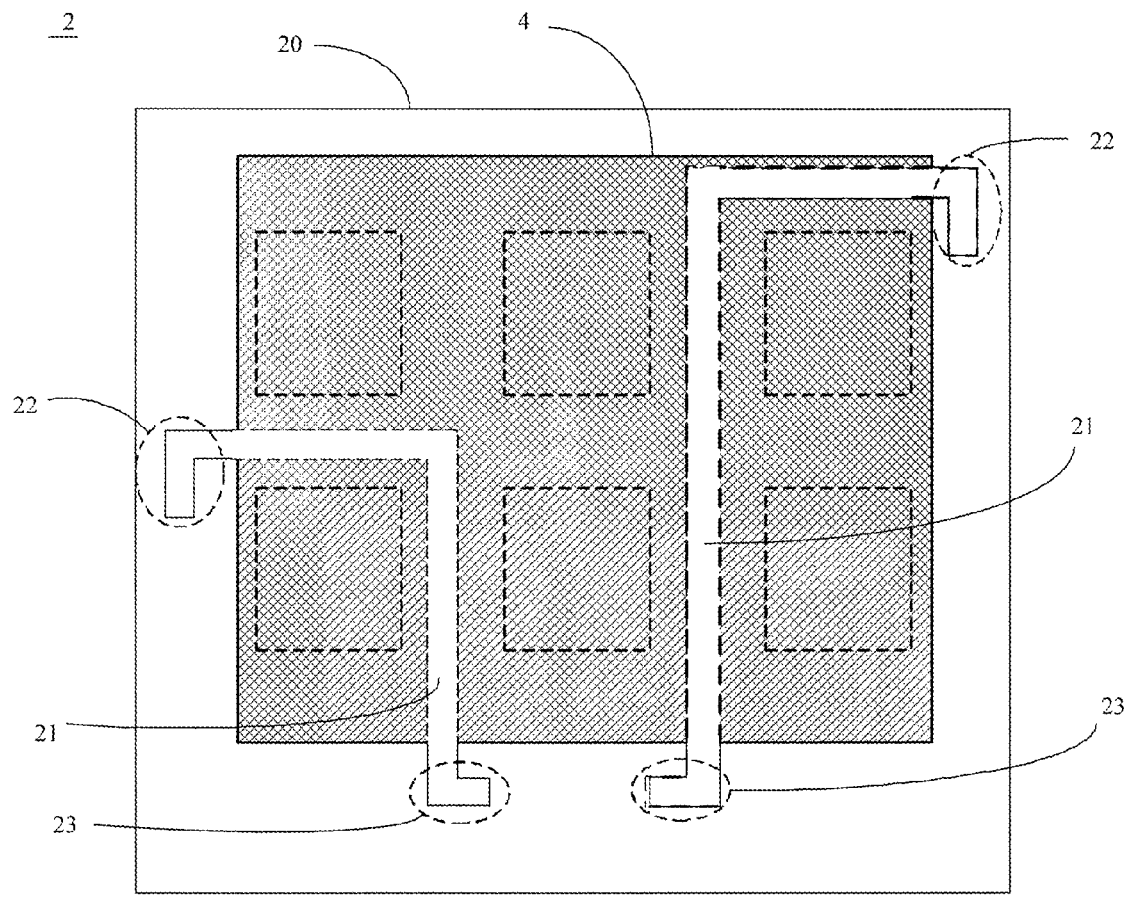
FIG. 9 is a top view of a first substrate according to an embodiment of the disclosure.
Figure 10:
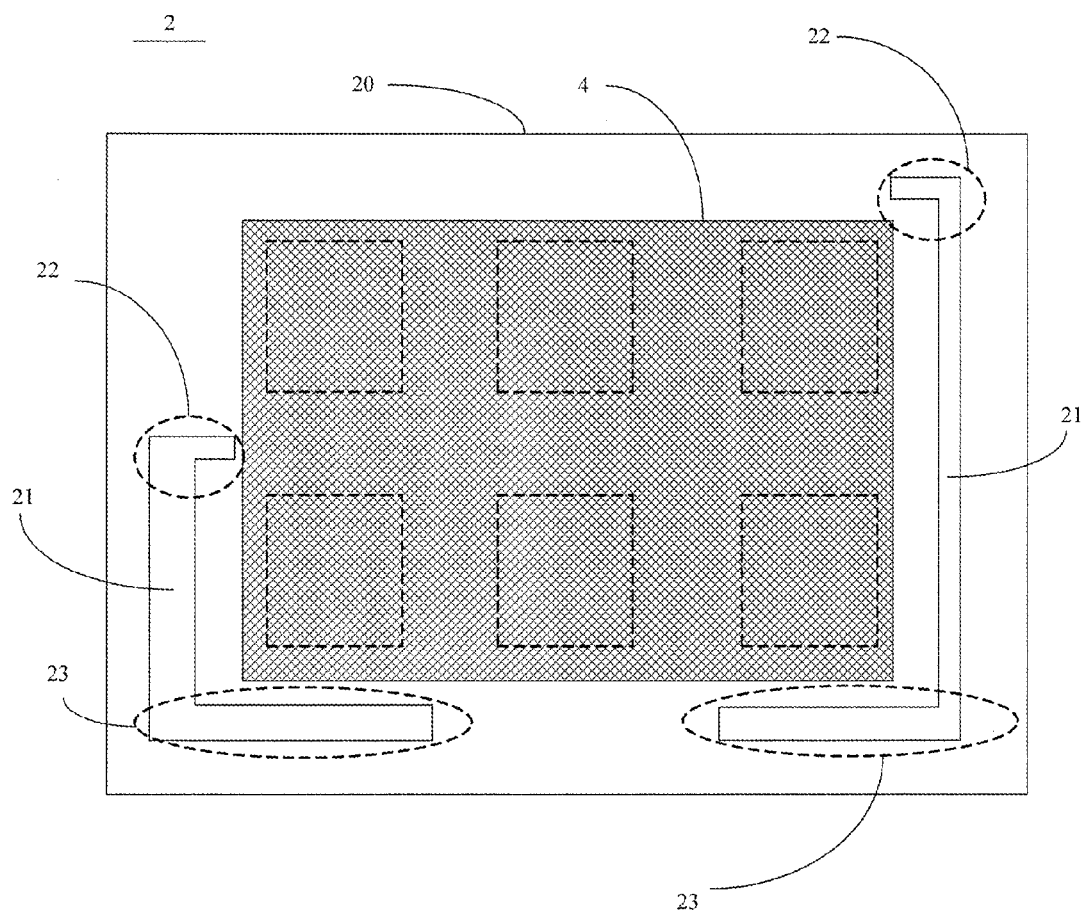
FIG. 10 is a top view of a first substrate according to an embodiment of the disclosure.

Another embodiment is further provided according to the disclosure, and the same detail(s) with the above embodiments is not described repeatedly. In the embodiment, as shown in FIG. 9, the planarization layer 4 is not disposed on the whole surface of the base substrate 20 facing the second substrate 3, namely, the planarization layer 4 is disposed on partial surface of the base substrate 20 facing the second substrate 3,and the third connecting terminal 22 and the fourth connecting terminal 23 are not covered by the planarization layer 4.The wiring pattern of the first conducting wire 21 may also be as that shown in FIG. 10. It should be noted that the wring pattern of the first conducting wire is not limited in the embodiment of the disclosure, and the wring pattern of the first conducting wire in the embodiments and the accompanying drawings is only illustrative and not intended for limitation.

Figure 11:
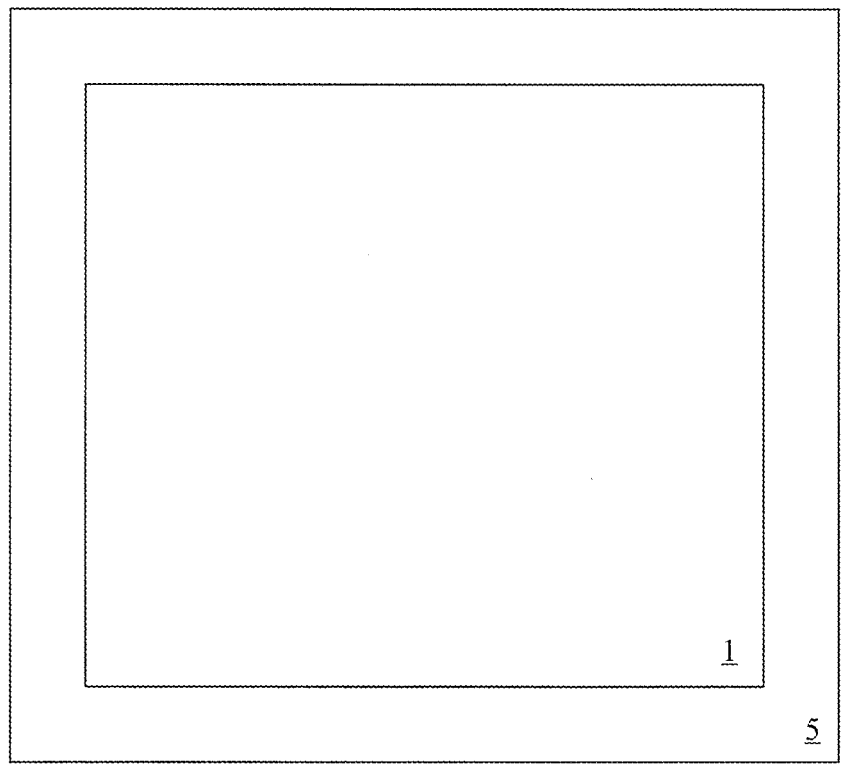
FIG. 11 is a schematic structural diagram of a display device according to an embodiment of the disclosure.

As shown in FIG. 11, a display device 5 is further provided according to the disclosure, the display device 5 includes a display panel 1, and the display panel may be any one of the display panels described in the above embodiments.

The display panel 1 further includes a pixel electrode (not shown) disposed on the second substrate.

Typically, the display device is a liquid crystal display device. And the display device in the embodiments may be a display device of TN-type, VA-type, IPS or FFS mode.

But in another embodiment, the display device in the embodiment may be an electronic paper or an OLED display device.

In view of the above, the display panel with a narrowed border as described above may be used in the display device according to the embodiments of the disclosure, and thereby the border of the display device is narrowed.

Those described above are preferred embodiments of the disclosure. It should be noted that improvements and modifications may be made by those skilled in the art without departing from the principle of the disclosure. It will be appreciated that the invention is intended to cover all modifications and equivalents within the scope of the appended claims.

What is claimed is:

1. A display panel, comprising:
a first substrate comprising a first conducting wire, wherein the first conducting wire is disposed on an inner side of the first substrate;
a second substrate disposed opposite to the first substrate, wherein a gate line and a first connecting terminal for transmitting a gate drive signal are disposed on a side of the second substrate facing the first substrate, and the gate line comprises a second connecting terminal at one end of the gate line; and
a connecting layer disposed between the first substrate and the second substrate,
wherein the first connecting terminal and the second connecting terminal are electrically connected to two ends of the first conducting wire via the connecting layer respectively, and the second connecting terminal is electrically connected to the first connecting terminal via the first conducting wire, so that the gate drive signal transmitted from the first connecting terminal is received by the gate line.

2. The display panel according to claim 1, wherein the first conducting wire comprises a third connecting terminal and a fourth connecting terminal, the third connecting terminal and the fourth connecting terminal are located at the two ends of the first conducting wire respectively, wherein
the first connecting terminal is electrically connected to the fourth connecting terminal via the connecting layer, and the second connecting terminal is electrically connected to the third connecting terminal via the connecting layer.

3. The display panel according to claim 2, wherein the second substrate comprises:
an extending portion;
a second conducting wire disposed in the extending portion; and
a driver unit disposed in the extending portion and configured to output the gate drive signal to the first connecting terminal via the second conducting wire.

4. The display panel according to claim 2, wherein the first substrate further comprises a common electrode layer disposed on a side of the first substrate facing the second substrate, the common electrode layer comprising a first electrode, and a common potential applied to the first electrode.

5. The display panel according to claim 4, wherein the first electrode and the first conducting wire are disposed in a same layer, the common electrode layer further comprises a slit, and the first electrode and the first conducting wire are insulated from each other by the slit.

6. The display panel according to claim 4, wherein the first substrate further comprises a first conductive layer, the first conductive layer being disposed on a side of the common electrode layer facing away from the second substrate, wherein the first conducting wire and the first conductive layer are disposed in a same layer.

7. The display panel according to claim 6, wherein
the common electrode layer further comprises a second electrode and a third electrode, and
the first electrode, the second electrode and the third electrode are insulated from one another.

8. The display panel according to claim 7, wherein the second electrode is electrically connected to the third connecting terminal, the third connecting terminal being electrically connected to the first connecting terminal via the second electrode; wherein the third electrode is electrically connected to the fourth connecting terminal, the fourth connecting terminal being electrically connected to the second connecting terminal via the third electrode.

9. The display panel according to claim 8, wherein a location of the second electrode on the first substrate corresponds to a location of the third connecting terminal or of the fourth connecting terminal on the first substrate; wherein a location of the third electrode corresponds to a location of the fourth connecting terminal or of the third connecting terminal on the first substrate.

10. The display panel according to claim 6, wherein the first substrate further comprises a first insulating layer, the first insulating layer being disposed between the first conductive layer and the common electrode layer.

11. The display panel according to claim 2, wherein the first substrate comprises a base substrate and a second conductive layer disposed on a side of the base substrate facing the second substrate, wherein the first conducting wire and the second conductive layer are disposed in a same layer.

12. The display panel according to claim 11, wherein the first substrate further comprises a planarization layer disposed on a side of the second conductive layer facing the second substrate.

13. The display panel according to claim 12, wherein the planarization layer is disposed on a whole surface of the base substrate facing the second substrate, the planarization layer comprising a plurality of second openings, locations of the second openings on the first substrate correspond to locations of the third connecting terminal and the fourth connecting terminal on the first substrate respectively, so that the third connecting terminal and the fourth connecting terminal are exposed through the second openings.

14. The display panel according to claim 13, wherein a number of the second openings is equal to a sum of a number of the third connecting terminals and a number of the fourth connecting terminals.

15. The display panel according to claim 12, wherein the planarization layer is disposed on a partial surface of the base substrate facing the second substrate, and the third connecting terminal and the fourth connecting terminal are uncovered by the planarization layer.

16. The display panel according to claim 1, wherein the first substrate further comprises a black matrix layer and a color filter layer sequentially disposed in a direction toward the second substrate, wherein the color filter layer comprises a plurality of color filter units, and the black matrix layer comprises a plurality of first openings exposing the plurality of color filter units.

17. The display panel according to claim 16, wherein the first conducting wire is made of a transparent conductive material or a metal, and in the case that the first conducting wire is made of a metal, the first conducting wire is not located in an area of the color filter unit.

18. The display panel according to claim 2, wherein a location of the first connecting terminal on the second substrate corresponds to a location of the third connecting terminal or of the fourth connecting terminal on the first substrate; a location of the second connecting terminal on the second substrate corresponds to a location of the fourth connecting terminal or of the third connecting terminal on the first substrate.

19. The display panel according to claim 1, wherein

The connecting layer is made of an anisotropic conductive film or a conductive gold ball, and in the case that the connecting layer is made of the conductive gold ball, there are $1/30000$-$0.02$ conductive gold balls per square micrometer.

20. A display device, comprising a display panel, the display panel comprising:

a first substrate comprising a first conducting wire, wherein the first conducting wire is disposed on an inner side of the first substrate;

a second substrate disposed opposite to the first substrate, wherein a gate line and a first connecting terminal for transmitting a gate drive signal are disposed on a side of the second substrate facing the first substrate, and the gate line comprises a second connecting terminal at one end of the gate line; and a connecting layer disposed between the first substrate and the second substrate, wherein the first connecting terminal and the second connecting terminal are electrically connected to two ends of the first conducting wire via the connecting layer respectively, and the second connecting terminal is electrically connected to the first connecting terminal via the first conducting wire, so that the gate drive signal transmitted from the first connecting terminal is received by the gate line.

* * * * *